United States Patent [19] [11] 4,397,885
Akai et al. [45] Aug. 9, 1983

[54] METHOD AND APPARATUS FOR TREATING FLUORESCENT SUBSTANCE

[75] Inventors: Yoshimi Akai, Yokohama; Akira Taya, Kawasaki; Leo Mori, Yokohama; Kazuo Narita, Yokohama; Masahiko Hirose, Yokohama, all of Japan

[73] Assignee: Tokyo Shibaura Denki Kabushiki Kaisha, Japan

[21] Appl. No.: 285,320

[22] Filed: Jul. 22, 1981

[30] Foreign Application Priority Data

Aug. 22, 1980 [JP] Japan .................. 55-114686

[51] Int. Cl.³ ............................................. B05D 3/06
[52] U.S. Cl. ....................... 427/38; 118/50.1; 422/186; 427/64; 427/242
[58] Field of Search ............. 427/35, 36, 38, 39, 427/64, 67, 68, 242; 204/164, 193; 118/730, 50.1; 422/186, 186.01, 186.02, 186.03, 186.04, 186.05, 186.06

[56] References Cited

U.S. PATENT DOCUMENTS 2,601,178 6/1952 Spencer .......................... 204/164
2,965,786 12/1960 Aia et al. ......................... 313/109
3,490,052 1/1970 Guggenheim et al. ............ 204/164
3,738,828 6/1973 Inoue ............................... 204/164
3,932,760 1/1976 Inoue ............................... 250/492
4,039,699 8/1977 Morimoto et al. .................. 427/38
4,065,369 12/1977 Ogawa et al. ................. 422/186.05
4,116,161 9/1978 Steube ............................. 118/730
4,175,235 11/1979 Niwa et al. .................... 422/186.05

FOREIGN PATENT DOCUMENTS 52-151555 6/1977 Japan .
52-151558 6/1977 Japan .
1469317 4/1977 United Kingdom .

Primary Examiner—John H. Newsome
Attorney, Agent, or Firm—Cushman, Darby & Cushman

[57] ABSTRACT

A method and an apparatus for treating fluorescent substances used in illumination lamps or cathode ray tubes for television receivers. A gas plasma is produced by passing a gas through a discharge tube. The gas plasma including the active species are directed so as to bring the active species into contact with the fluorescent substance, the fluorescent substance being placed at a region separated from the plasma producing region.

12 Claims, 10 Drawing Figures

METHOD AND APPARATUS FOR TREATING FLUORESCENT SUBSTANCE

BACKGROUND OF THE INVENTION

This invention relates to a method and an apparatus for treating the fluorescent substances used in illumination lamps, cathode ray tubes for television receivers and the like.

Such fluorescent substances should have excellent luminous efficacy and a long life. However, the luminous efficacy of conventional fluorescent substances decreases with time as a result of short wavelength ultraviolet irradiation. Accordingly, the intensity of fluorescent lamps gradually decreases during use. Particularly, the fluorescent substances containing halogen significantly exhibit such a tendency.

U.S. Pat. No. 2,965,786 describes a fluorescent substance which contains between about 0.01 and 0.25 gram-atoms of cadmium per 3.00 gram-moles of phosphate. However, ultraviolet irradiation still lowers the luminous efficacy by too great a degree.

Japanese patent Disclosure No. 151555/77 and No. 151558/77 describe a method for treating with plasma the surface of a fluorescent layer formed on a substrate. However, in this method, the fluorescent layer is placed in a plasma-producing region where intense short wavelength ultraviolet irradiation is produced. The fluorescent layer is thus damaged by the ultraviolet irradiation and ion bombardment.

Also, the known electrostatic coating technique is typically employed to apply the fluorescent coating to fluorescent lamps and high voltage fluorescent mercury lamps. With the electrostatic coating technique, cohesion between powder particles of the fluorescent substance should be very small and fluidity and dispersion of the fluorescent powder should be large. A method which adds a small amount of almina or silica to the fluorescent substance so as to reduce the cohesion and increase the fluidity of the fluorescent substance is known. However, almina and silica lower the luminous efficacy of the fluorescent substance, and the life of the fluorescent lamp is shortened.

SUMMARY OF THE INVENTION

It is an object of this invention to provide a method and an apparatus for treating fluorescent substances to achieve excellent luminous efficacy and high stability against ultraviolet irradiation.

It is another object of this invention to provide a method and an apparatus for treating fluorescent substances, to achieve low cohesion and high fluidity and dispersion.

In accordance with a preferred embodiment of this invention, a gas plasma is produced by gas discharge utilizing microwaves. The fluorescent substance to be treated is placed in a reaction region separated from the gas discharge region. Active species in the gas plasma are transmitted from the gas discharge region to the reaction region so as to be made to react with the fluorescent substance. The fluorescent substance treated by this method has excellent luminous efficacy, high stability against ultraviolet irradiation, reduced cohesion and increased fluidity.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings, in which.

DESCRIPTION OF PREFERRED EMBODIMENTS

Figure 1:
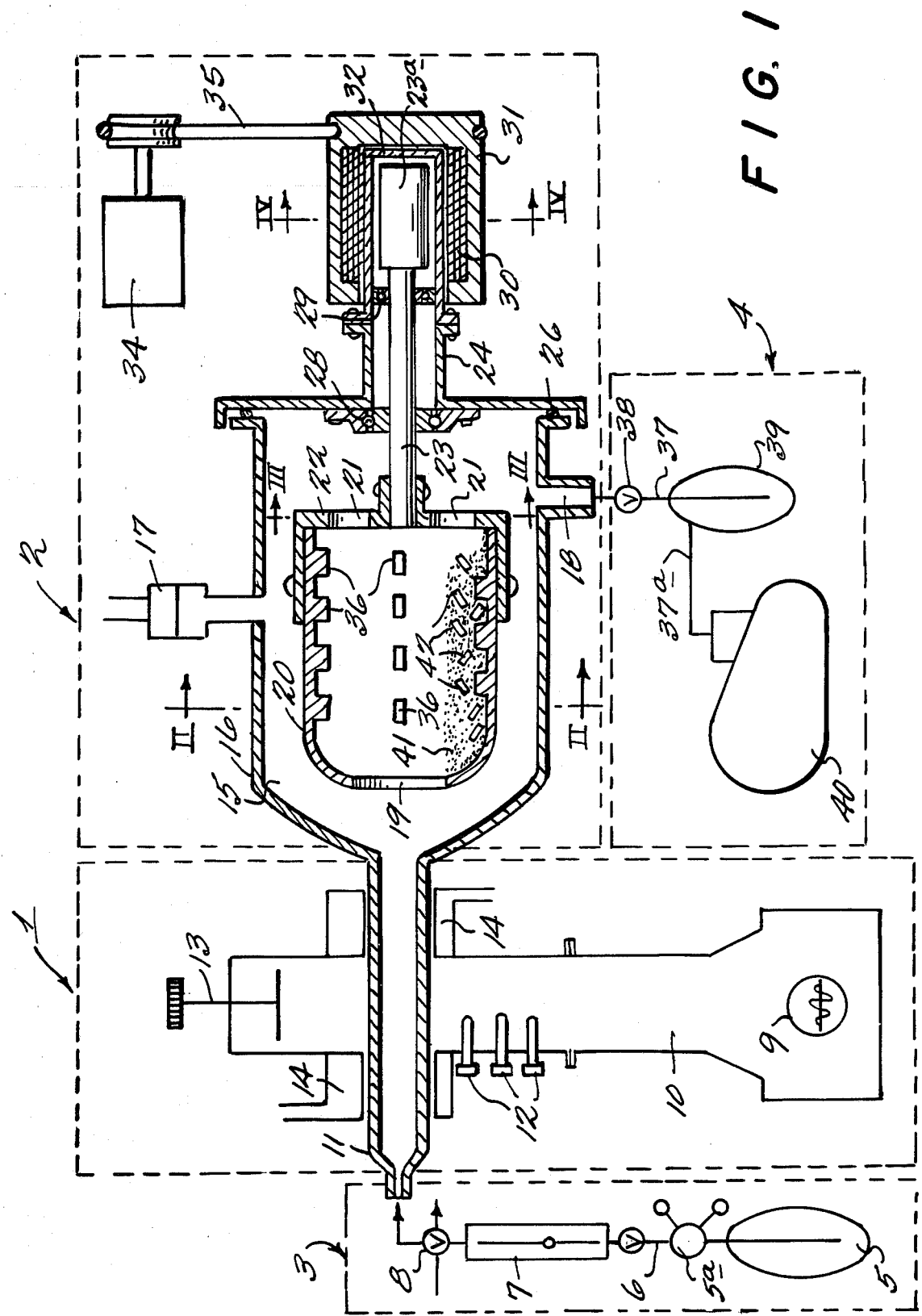
FIG. 1 is an illustration of one embodiment of a fluorescent substance treatment apparatus according to the present invention, in which a part of the apparatus is illustrated with a longitudinal sectional view.
Figure 2:
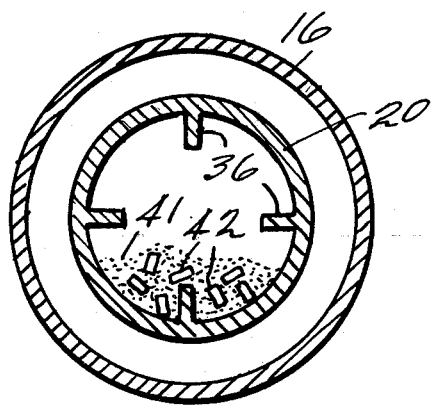
FIGS. 2 to 4 show sections of the apparatus taken along the lines II—II, III—III, and IV—IV of FIG. 1, respectively.

Referring to FIG. 1, one embodiment of the present invention includes a plasma generating section 1, a section 2 for treating a fluorescent substance with active species produced in plasma generating section 1, a section 3 for supplying gas to plasma generating section 1, and an exhaust section 4 for reducing the pressure in fluorescent substance treatment section 2.

Gas supplying section 3 includes a gas cylinder 5 having a switching valve 5a. A pipe 6 supplies gas from gas cylinder 5 to plasma generating section 1. The flow rate of gas is adjusted by a flow meter 7 and a needle valve 8. Preferable gasses include Ar, He, Kr, Ne, Xe, $H_2$, $N_2$, $O_2$, methane halide (for example $CF_4$), $CCl_4$, $CCl_2F_2$ or a mixture thereof. Specially, using the mixture of $N_2$ and $H_2$ is preferable because this mixture improves the luminous efficacy of the fluorescent substance and the stability against ultraviolet irradiation. Also using methane halide gas is preferable because the cohesion and fluidity of the fluorescent substance are improved.

Plasma generating section 1 includes a microwave ocsillator 9 such as a magnetron. A waveguide 10 transmits microwaves from oscillator 9 to a discharge tube 11 which penetrates waveguide 10 for producing the plasma therein. Discharge tube 11 is ordinarily made of quartz and has one end connected to pipe 6 for receiving the gas. Waveguide 10 is provided with an impedance matching means comprising a three-stub tuner 12 and plunger 13. Discharge tube 11 is provided with a water-cooling apparatus 14 which cools discharge tube 11.

Fluorescent substance treatment section 2 includes a closed and preferably cylindrical shaped vessel 16 into which the other end of discharge tube 11 opens. Vessel 16 is axially aligned with the axis of discharge tube 11. Vessel 16 may be made of quartz and formed integrally with discharge tube 11. Otherwise, vessel 16 may be metal, such as stainless steel. A treatment chamber 15 is formed in vessel 16 in which the fluorescent substance is treated with the plasma from discharge tube 11. A capacitance manometer 17 is mounted to the outer wall of vessel 16 to monitor the pressure in chamber 15 during operation of the apparatus.

Vessel 16 is also provided with a gas outlet 18, preferably located near the end of vessel 16 opposite discharge tube 11 to enable the active species in the plasma produced within discharge tube 11 to flow about the fluorescent substance held in the center of chamber 15 before being exhausted.

Figure 3:
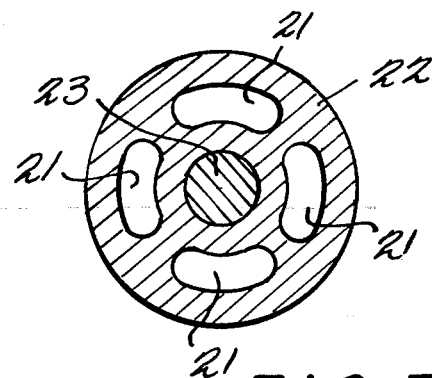

The fluorescent substance is preferably stirred while being treated to ensure uniform treatment. Accordingly, a stirring mechanism is provided including a preferably cylindrical container 20 disposed in chamber 15 in an axial alignment with the axis of discharge tube 11. Fluorescent substance 41 is held in container 20. One end 19 of container 20 is opened and faces discharge tube 11. The other end of container 20 is covered with a plate 22 having holes 21 as shown in FIG. 3. Plate 22 is fixed to a driving shaft 23. The inside wall of cylindrical container 20 is provided with a plurality of integral projections 36 for stirring the fluorescent substance 41. The end of vessel 16 is covered with an annular cover 25. The center of cover 25 is provided with a cylindrical housing 24 which houses driving shaft 23 and a ferromagnetic substance 23a such as steel combined with the end of driving shaft 23. O-rings 26 provide an air-tight seal between vessel 16 and cover 25. The sealing between vessel 16 and cover 25 is aided by a partial vacuum produced in vessel 16 by exhaust section 4.

Cover 25 is provided with bearings 28 and 29. Bearing 28 is disposed at the entrance of cylindrical housing 24 and bearing 29 is disposed within cylindrical housing 24. Driving shaft 23 is rotatably supported by bearings 28 and 29.

Figure 4:
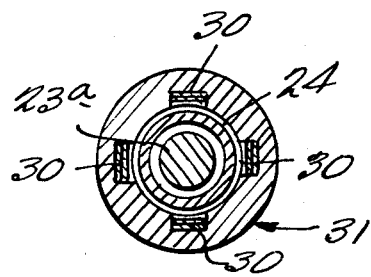

A cylindrical rotary body 31 is supported around housing 24, but out of contact with it, by a supporting mechanism (not shown). A plurality of (four, for example) permanent magnets or electromagnets 30 are mounted at equal distances from one another on the inside wall of body 31 (see FIG. 4). Rotary body 31 is rotated by a motor 34 via a belt 35. Driving shaft 23 is rotated with body 31, because the magnetic field formed by magnets 30 is rotated in response to the rotation of body 31. Cylindrical container 20 is rotated by the rotation of driving shaft 23. Accordingly, the apparatus of the invention can rotate cylindrical container 20 and stir fluorescent substance 41 while cylindrical container 20 is kept air-tight.

Exhaust section, generally shown at 4, includes a trap 39 connected to gas outlet 18 by a pipe 37 having a valve 38. A rotary pump 40 is connected to trap 39 by a pipe 37a.

In operation, the fluorescent substance is disposed in cylindrical container 20. Then, pump 40 exhausts vessel 16 to a pressure of less than about $10^{-3}$ Torr. Thereafter, switching valve 5a is opened so as to supply gas from gas cylinder 5 into discharge tube 11 through gas flow meter 7 and needle valve 8. The pressure in chamber 15 is preferably adjusted to between about $10^{-1}$ and about 5 Torr. and the gas flow rate is preferably adjusted to between about 30 and about 300 cc/min. while exhausting continues. The pressure and the gas flow rate are controlled by needle valve 8 while monitoring capacitance manometer 17 and gas flow meter 7.

Under the conditions described above, 100–500 watt microwaves having a frequency of 2,450 MHz are transmitted from oscillator 9 to discharge tube 11 by matching impedances using three-stub tuner 12 and plunger 13. As a result, the gas flowing in discharge tube 11 is discharged and the plasma is produced. The plasma flows into chamber 15 along with the gas flow. Active species in the plasma having a short life cease to exist on their way to chamber 15. Therefore, only active species with a long life contact fluorescent substance 41 held in cylindrical container 20. Fluorescent substance 41 is stirred by rotating cylindrical container 20. Stirring is particularly effective when fluorescent substance 41 is mixed with quartz stir chips 42. The qualities of fluorescent substance 41 are remarkably impaired when it is mixed with impurities, especially heavy metals. Therefore, cylindrical container 20 and stir chips 42 are preferably made of quartz. Stir chips 42 in the form of cylinders about 8 to about 15 mm in diameter and about 10 to about 20 mm in length work well to obtain an excellent stirring efficiency. Using this method and apparatus the fluorescent substance is treated for usually 10 minutes to 4 hours.

The method of the present invention may be applied to the treatment of many kinds of fluorescent substances such as, for example, $[Ca_{10}(PO_4)_6FCl:Sb, Mn]$, $[Sr_{10}(PO_4)_6FCl:Sb, Mn]$, $[Zn_2SiO_4:Mn]$, $[Y_2O_3:Eu]$, $[ZnS:Ag,Cl]$, $[ZnS:Cu, Au, Al]$, $[Y_2O_2S:Eu]$, $[Y(P-V)O_4:Eu]$, $[Y_2SiO_5:Ce, Tb]$ and $[(Sr, Ca)_{10}(PO_4)_6Cl_2:Eu]$.

Figure 5:
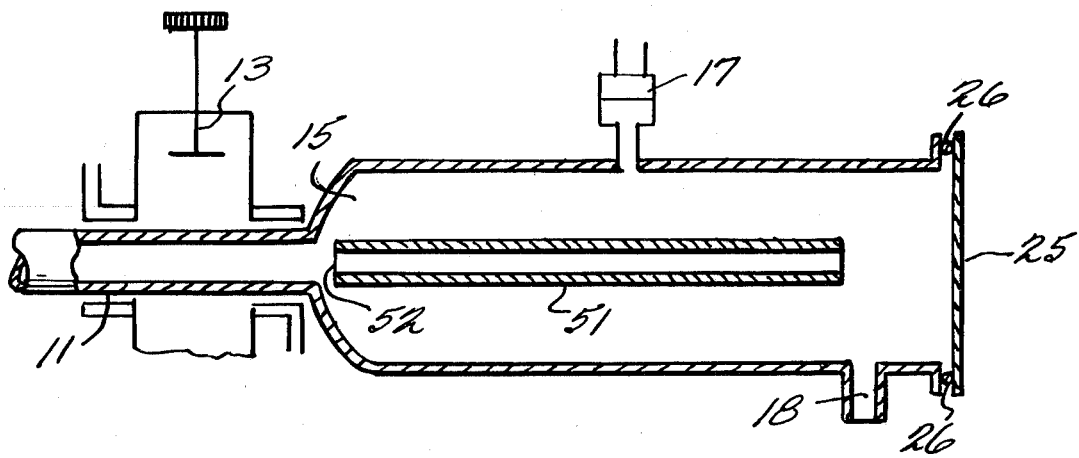
FIG. 5 is a longitudinal sectional view showing a part of another embodiment of a fluorescent substance treatment apparatus according to the present invention.

The fluorescent substance may be treated while it is coated on the surface of a cathode ray tube or an illumination lamp, as well as when it is a powder. FIG. 5 illustrates another embodiment of this invention which is capable of processing fluorescent substances coated on surfaces. In FIG. 5, like reference characters designate similar parts to that of FIG. 1. The treatment apparatus of this embodiment does not have the cylindrical container for stirring the fluorescent substance in the chamber. A glass tube 51 for a fluorescent lamp, having the fluorescent substance coated on the inside thereof is arranged in chamber 15 such that one open end 52 of it faces discharge tube 11. The plasma produced in discharge tube 11 flows into glass tube 51 and contacts with the fluorescent substance coated on glass tube 51 to treat the fluorescent substance.

As described above, the method and the apparatus of this invention brings the active species in the plasma into contact with the fluorescent substance at a region (chamber 15) separated from the plasma producing region (discharge tube 11) where intense short wavelength ultraviolet irradiation is also produced. Therefore, the fluorescent substance is protected from the short wavelength ultraviolet irradiation. The fluorescent substance treated according to the present invention has excellent luminous efficacy and ultraviolet irradiation resistance characteristics. The cohesion between fluorescent substance powder particles is reduced and the fluidity of the fluorescent substance is improved. As a result, the efficiency of the subsequent coating operation with the fluorescent substance is exceedingly improved.

The following examples serve to establish the superior qualities of a fluorescent substance treated by the plasma according to the method of the present invention.

EXAMPLE 1

Several kinds of fluorescent substances are treated by the apparatus shown in FIG. 1. The treated fluorescent substances were excited by ultraviolet irradiation with a wavelength of 254 nm, and their relative luminous efficacy were measured. The conditions during treatment and the luminous efficacy are shown in Table 1, below, in which the luminous efficacy is shown as a value relative to 100 which is the luminous efficacy of the fluorescent substance prior to treatment:

TABLE 1

| FLUORESCENT SUBSTANCE | GAS | DISCHARGE POWER | TREATING TIME | RELATIVE LUMINOUS EFFICACY |
|---|---|---|---|---|
| $Ca_{10}(PO_4)_6FCl$: Sb, Mn | Ar 3.5 (Torr) | 150 (W) | 30 (min) | 101.9 |
| | Ar 3.5 | 500 | 30 | 102.6 |
| | He 7.6 | 500 | 30 | 101.8 |
| | $N_2 + H_2$ 0.5  0.5 | 500 | 30 | 102.2 |
| | $N_2 + H_2$ 1.8  0.1 | 150 | 30 | 102.2 |
| | $N_2 + H_2$ 3.1  0.1 | 500 | 30 | 102.1 |
| | $N_2 + H_2$ 1.4  20.0 | 500 | 30 | 101.9 |
| | $Ar + H_2$ 3.5  0.1 | 500 | 30 | 102.8 |
| | $N_2 + H_2 + CF_4$ 1.8  0.1  0.1 | 500 | 10 | 102.6 |
| | $N_2 + H_2 + CF_4$ 1.8  0.1  0.1 | 150 | 30 | 103.9 |
| $Sr_{10}(PO_4)_6FCl$: Sb, Mn | Ar 3.5 | 500 | 30 | 103.1 |
| | $N_2 + H_2$ 0.5  0.5 | 500 | 30 | 102.4 |
| | $Ar + H_2$ 3.5  0.1 | 500 | 30 | 101.8 |
| $Zn_2SiO_4$:Mn | Ar 3.5 | 500 | 30 | 102.0 |
| | $N_2 + H_2$ 0.5  0.5 | 500 | 30 | 102.8 |
| $Y_2O_3$:Eu | Ar 3.5 | 500 | 30 | 103.0 |
| | $N_2 + H_2$ 0.5  0.5 | 500 | 30 | 102.2 |

Thus, the luminous efficacy of the fluorescent substance treated according to the present invention is improved by about 2-4%.

EXAMPLE 2

Several kinds of fluorescent substances were treated by the apparatus shown in FIG. 1. Then, they were irradiated in a vacuum for four hours by ultraviolet irradiation predominantly with a wavelength of 185 nm. Thereafter, the fluorescent substances were excited by ultraviolet irradiation with the wavelength of 254 nm, and their luminous efficacy were measured. The conditions during treatment and the luminous efficacy are shown in Table 2, below, in which the luminous efficacy is also shown as a value relative to 100 which is the luminous efficacy of the untreated fluorescent substance which underwent the same irradiation.

TABLE 2

| FLUORESCENT SUBSTANCE | GAS | DISCHARGE POWER | TREATING TIME | RELATIVE LUMINOUS EFFICACY |
|---|---|---|---|---|
| $Ca_{10}(PO_4)_6FCl$: Sb, Mn | Ar 0.2 (Torr) | 500 (W) | 30 (min) | 102.8 |
| | Ar 0.2 | 500 | 240 | 102.9 |
| | Ar 0.5 | 500 | 30 | 102.8 |
| | Ar 0.5 | 300 | 30 | 103.1 |
| | Ar 0.5 | 300 | 120 | 102.3 |
| | Ar 1.5 | 500 | 30 | 103.5 |
| | Ar 2.0 | 500 | 30 | 102.9 |
| | Ar 2.0 | 500 | 60 | 102.4 |
| | Ar 2.0 | 500 | 120 | 102.0 |
| | Ar 3.5 | 500 | 30 | 105.8 |
| | Ar 3.5 | 500 | 120 | 102.3 |
| | Ar 3.5 | 500 | 240 | 102.6 |
| | Ar 3.5 | 150 | 30 | 102.7 |
| | Ar 3.5 | 150 | 120 | 102.4 |
| | He 3.5 | 500 | 30 | 101.8 |
| | He 7.6 | 500 | 180 | 103.1 |
| | $N_2$ 3.5 | 500 | 30 | 103.6 |
| | $H_2$ 3.5 | 500 | 30 | 103.1 |
| | $CF_4$ 0.2 | 500 | 5 | 102.3 |
| | $CF_4$ 0.2 | 500 | 30 | 103.1 |
| | $N_2 + H_2$ 0.5  0.5 | 500 | 30 | 107.7 |
| | $N_2 + H_2$ 1.8  0.1 (Torr) | 500 (W) | 30 (min) | 104.7 |
| | $N_2 + H_2$ | 150 | 30 | 105.9 |

TABLE 2-continued

| FLUORESCENT SUBSTANCE | TREATMENT CONDITION | | | RELATIVE LUMINOUS EFFICACY |
|---|---|---|---|---|
| | GAS | DISCHARGE POWER | TREATING TIME | |
| | 1.8  0.1 | | | |
| | $N_2 + H_2$ | 500 | 30 | 105.1 |
| | 3.1  0.1 | | | |
| | $N_2 + H_2$ | 500 | 30 | 105.4 |
| | 2.6  12.0 | | | |
| | $N_2 + H_2$ | 500 | 30 | 106.1 |
| | 1.4  20.0 | | | |
| | $Ar + CF_4$ | 500 | 5 | 102.3 |
| | 3.5  0.1 | | | |
| | $Ar + CF_4$ | 500 | 30 | 101.8 |
| | 3.5  0.1 | | | |
| | $Ar + CF_4$ | 150 | 15 | 101.8 |
| | 3.5  0.1 | | | |
| | $Ar + H_2$ | 500 | 30 | 102.6 |
| | 3.5  0.1 | | | |
| | $N_2 + H_2 + CF_4$ | 500 | 10 | 102.4 |
| | 1.8  0.1  0.1 | | | |
| | $N_2 + H_2 + CF_4$ | 150 | 10 | 102.8 |
| | 1.8  0.1  0.1 | | | |
| $Sr_{10}(PO_4)_6FCl$: Sb, Mn | Ar 3.5 | 500 | 30 | 103.1 |
| | Ar 0.5 | 500 | 30 | 102.4 |
| | $N_2 + H_2$ | 500 | 30 | 104.1 |
| | 0.5  0.5 | | | |
| $Zn_2SiO_4$:Mn | Ar 3.5 (Torr) | 500 (W) | 30 (min) | 102.6 |
| | Ar 0.5 | 500 | 30 | 103.8 |
| | $N_2 + H_2$ | 500 | 30 | 104.1 |
| | 0.5  0.5 | | | |
| $Y_2O_3$:Eu | Ar 3.5 | 500 | 30 | 101.9 |
| | $N_2 + H_2$ | 500 | 30 | 104.3 |
| | 0.5  0.5 | | | |
| $Ca_{10}(PO_4)_6FCl$: Sb, Mn | $O_2 + CF_4$ | 500 | 30 | 101.8 |
| | 0.2  0.2 | | | |
| | $O_2 + CF_4$ | 500 | 30 | 101.6 |
| | 1.0  1.0 | | | |

Thus, the stability against short wavelength ultraviolet irradition of fluorescent substances treated according to the present invention is improved by 2-6% in comparison with the conventional fluorescent substances.

EXAMPLE 3

The luminous efficacy of the fluorescent substance $[Ca_{10}(PO_4)_6FCl:Sb, Mn]$ treated under the different conditions shown in Table 3, below, was measured by the same method as Example 1:

TABLE 3

| | | TREATMENT CONDITION | | |
|---|---|---|---|---|
| SAMPLE NO. | FLUORESCENT SUBSTANCE | GAS | DISCHARGE POWER | TREATING TIME |
| 1 | $Ca_{10}(PO_4)_6FCl$: Sb, Mn | — | — | — |
| 2 | $Ca_{10}(PO_4)_6FCl$: Sb, Mn | Ar 3.5 Torr | 500(W) | 15 min.-4 hr. |
| 3 | $Ca_{10}(PO_4)_6FCl$: Sb, Mn | $N_2 + H_2$ 0.5  0.5 Torr | 500 | 15 min.-4 hr. |

Figure 6:
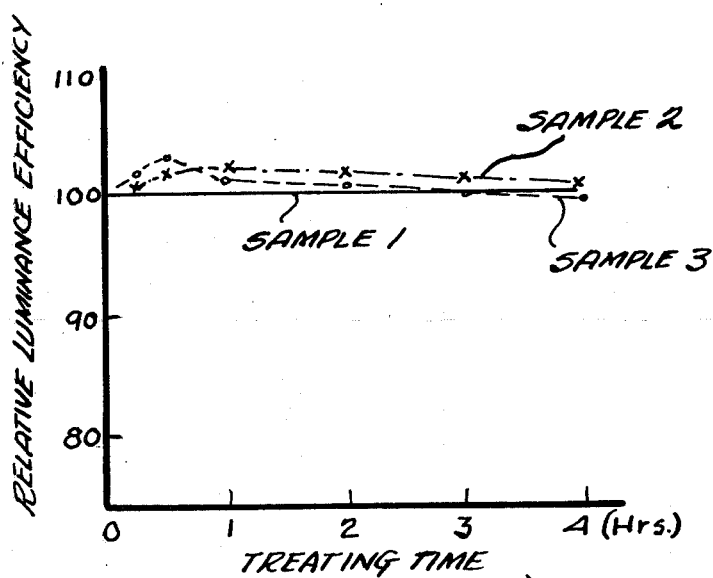
FIGS. 6 to 7 are graphs showing relationships between the treating time of the fluorescent substance $[Ca_{10}(PO_4)_6FCl:Sb, Mn]$ and its relative luminous efficacy when it is excited by the ultraviolet irradiation.

FIG. 6 illustrates the relationship between treatment time and the relative luminous efficacy. Thus, fluorescent substances treated for a relatively short time, especially for about 15 minutes to 2 hours, has excellent luminous efficacy.

EXAMPLE 4

Figure 7:
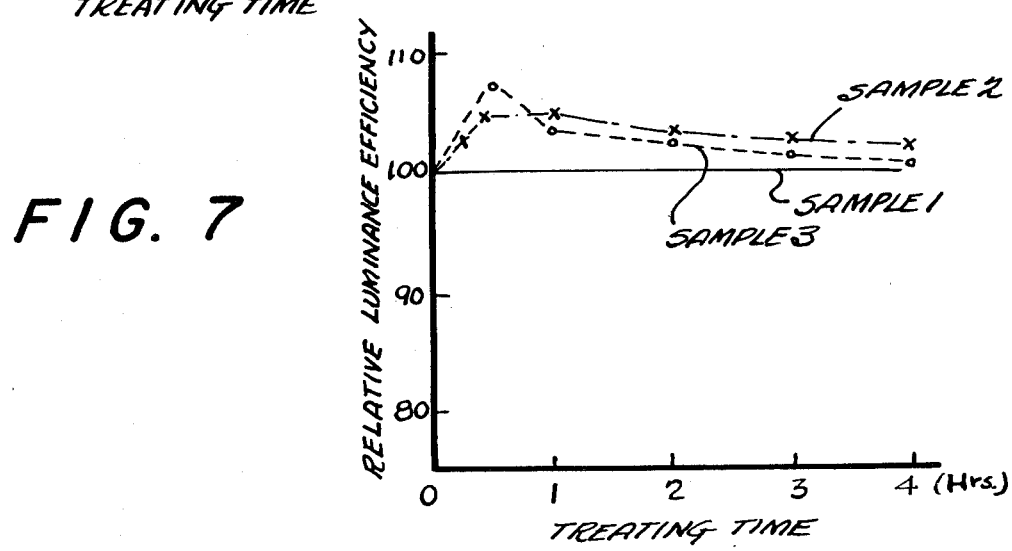

The three samples treated in Example 3 were irradiated by ultraviolet irradiation predominantly with a wavelength of 185 nm in the same manner as in Example 2 and then the relative luminous efficacy was measured by the same method as Example 1. FIG. 7 illustrates the fluorescent substances treated for a relatively short time, especially for about 15 minutes to 2 hours, have excellent stability against the short wavelength ultraviolet irradiation.

EXAMPLE 5

The fluorescent substances $[Y_2O_2S:Eu]$, $[ZnS:AgCl]$ and $[ZnS:Cu, Au, Al]$ were treated under the condition as shown in Table 4:

TABLE 4

| | | TREATMENT CONDITION | | |
|---|---|---|---|---|
| SAMPLE NO. | FLUORESCENT SUBSTANCE | GAS | DISCHARGE POWER | TREATING TIME |
| 4 | $Y_2O_2S$:Eu | — | — | — |
| 5 | $Y_2O_2S$:Eu | Ar 1.0 Torr | 500(W) | 30(min) |
| 6 | $Y_2O_2S$:Eu | $N_2 + H_2$ 0.5  0.5 | 500 | 30 |
| 7 | $Y_2O_2S$:Eu | $N_2$ 0.5 | 500 | 30 |
| 8 | ZnS:Ag, Cl | — | — | — |
| 9 | ZnS:Ag, Cl | Ar 1.0 | 500 | 30 |
| 10 | ZnS:Ag, Cl | $N_2 + H_2$ 0.5  0.5 | 500 | 30 |
| 11 | ZnS:Ag, Cl | $N_2$ 0.5 | 500 | 30 |
| 12 | ZnS:Cu, Au, Al | — | — | — |
| 13 | ZnS:Cu, Au, Al | Ar 1.0 | 500 | 30 |
| 14 | ZnS:Cu, Au, Al | $N_2 + H_2$ 0.5  0.5 | 500 | 30 |
| 15 | ZnS:Cu, Au, Al | $N_2$ 0.5 | 500 | 30 |

Figure 8:
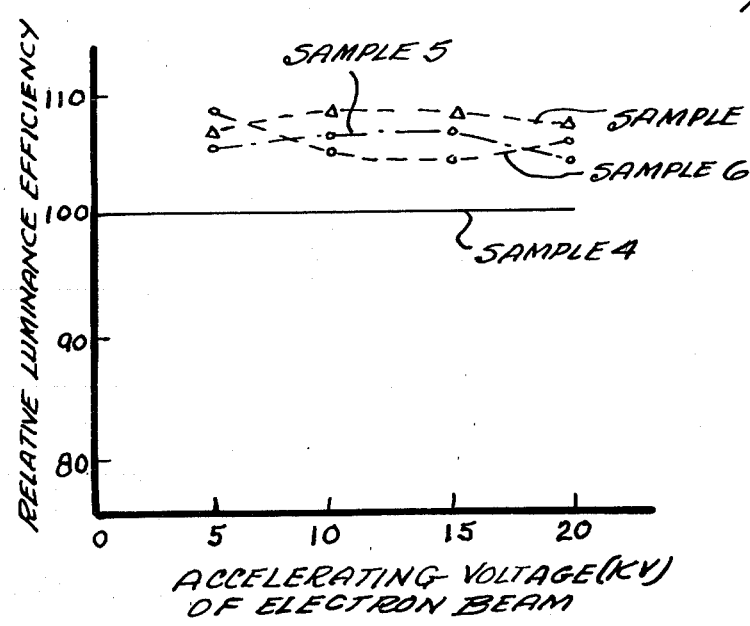
FIGS. 8 to 10 are graphs showing relationships between the relative luminous efficacy of kinds of fluorescent substances and the voltage for accelerating the electron beam when the fluorescent substance is excited by the electron beam.
Figure 9:
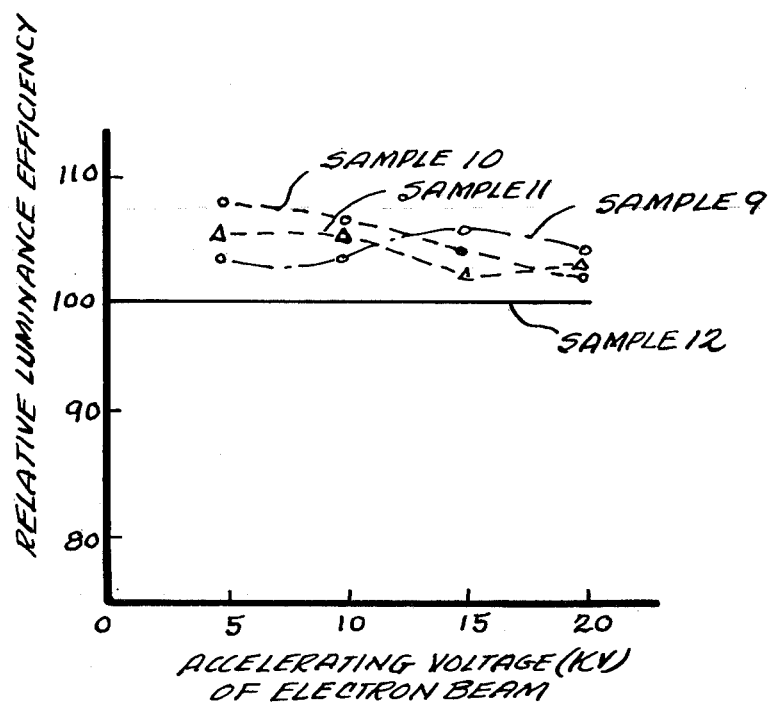
Figure 10:
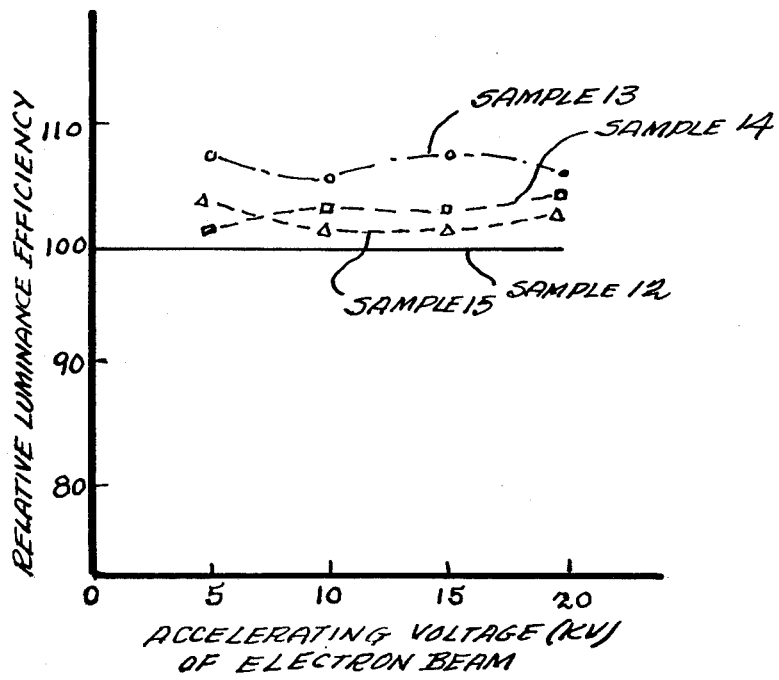

These fluorescent substances were excited by an electron beam and FIGS. 8-10 illustrate the relationship between the relative luminance efficiency and the accelerating voltage of the electron beam. Thus fluorescent substances treated by the present invention exhibit excellent luminous efficacy even when excited by an electron beam.

EXAMPLE 6

The fluorescent substances [$Ca_{10}(PO_4)_6FCl$:Sb, Mn] and [$Y(PV)O_4$:Eu] were treated under the condition as shown in Table 5:

TABLE 5

| FLUORESCENT SUBSTANCE | TREATMENT CONDITION | | |
|---|---|---|---|
| | GAS | DISCHARGE POWER | TREATING TIME |
| $Ca_{10}(PO_4)_6FCl$: Sb, Mn | $CF_4$ 1.0 Torr | 500 (W) | 2 (Hr.) |
| $Y(PV)O_4$:Eu | $CF_4$ 0.5 | 500 | 2 |

Angle of repose and the time necessary for the fluorescent substance to pass through a mesh were measured. For each fluorescent substance, a sample not treated by the plasma, and a sample to which 3–5% almina ($Al_2O_3$) was added were also measured. Table 6 illustrates the results:

TABLE 6

| FLUORESCENT SUBSTANCE | | ANGLE OF REPOSE | TIME PASS THROUGH MESH |
|---|---|---|---|
| $Ca_{10}(PO_4)_6FCl$: Sb, Mn | Treated | 46° | 20 (sec) |
| | Added $Al_2O_3$ | 50° ~ 60° | 24 |
| | Not treated | 60° < | ∞ |
| $Y(PV)O_4$:Eu | Treated | 42° | 18 |
| | Added $Al_2O_3$ | 50° ~ 60° | 23 |
| | Not treated | 60° < | 180 ~ 300 |

The length of time for the powder to pass through the mesh is a characteristic of the cohesion and the fluidity of the powder, and it was measured in the following manner. 50 grams of fluorescent powder was put on a horizontal wire screen which was vibrating vertically at 50 Hz. Then, the length of time for the powder to pass through the mesh was measured. Therefore, a shorter length of time indicates a lower powder cohesion and a greater fluidity. As apparent from the results, the cohesion and the fluidity of the fluorescent substance treated by the present invention is improved in comparison with the conventional fluorescent substance.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. A method for treating a fluorescent substance, said method comprising the steps of:
    producing gas plasma in a first region; and
    directing active species in the gas plasma to said fluorescent substance in a second region so as to bring the active species into contact with said fluorescent substance, said fluorescent substance in said second region being separated from said first region so as to be separated from ultraviolet radiation produced in said plasma producing step.
2. A method according to claim 1, further comprising the step of stirring said fluorescent substance while in contact with said active species.
3. A method according to claim 1, wherein said directing step comprises the step of directing said active species to said fluorescent substance while it is coated on a substrate.
4. A method according to claim 2, wherein said stirring step comprises the step of rotating a cylindrical container about its axis, said container containing said fluorescent substance mixed with stir chips.
5. A method according to claim 4, wherein said container and stir chips are made of quartz.
6. A method according to claim 1, wherein said producing step comprises the step of producing a plasma from a gas selected from one of a first group consisting of Ar, He, Kr, Ne, Xe, $H_2$, $N_2$, $O_2$ and methane halide, and a second group consisting of mixtures of at least two gasses in said first group.
7. A method according to claim 6, wherein said producing step further comprises the step of producing a plasma from a mixture of $N_2$ and $H_2$.
8. A method according to claim 6, wherein said producing step further comprises the step of producing a plasma from methane halide.
9. An apparatus for treating a fluorescent substance comprising:
    means for generating microwaves;
    waveguide means, connected to said microwave generating means, for transmitting microwaves;
    discharge means, crosswise penetrating said waveguide means, for producing a plasma therein;
    gas supplying means, connected to one end of said discharge means, for supplying gas thereinto;
    a treatment chamber connected to the other end of said discharge means, said fluorescent substance being disposed in said treatment chamber;
    exhaust means, connected to the treatment chamber, for exhausting the gas therefrom;
    a container rotatably supported in said treatment chamber for holding the fluorescent substance; and
    means for rotating said container.
10. An apparatus according to claim 9 wherein said container is cylindrical and further comprises a plurality of integral projections on an inside wall of said container.
11. An apparatus according to claim 9 or 10 further comprising stir chips disposed in said container together with a fluorescent substance.
12. An apparatus according to claim 11 wherein said stir chips are made of quartz.

* * * * *